(12) United States Patent
Fujii

(10) Patent No.: US 9,437,801 B2
(45) Date of Patent: Sep. 6, 2016

(54) PIEZOELECTRIC DEVICE AND METHOD FOR USING SAME

(71) Applicant: FUJIFILM Corporation, Tokyo (JP)

(72) Inventor: Takamichi Fujii, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/661,114

(22) Filed: Mar. 18, 2015

(65) Prior Publication Data

US 2015/0194591 A1    Jul. 9, 2015

Related U.S. Application Data

(63) Continuation of application No. PCT/JP2013/074215, filed on Sep. 9, 2013.

(30) Foreign Application Priority Data

Sep. 19, 2012  (JP) .................................. 2012-205691

(51) Int. Cl.
*H01L 41/04* (2006.01)
*H01L 41/187* (2006.01)
(Continued)

(52) U.S. Cl.
CPC ......... *H01L 41/042* (2013.01); *H01L 41/0472* (2013.01); *H01L 41/0825* (2013.01); *H01L 41/1876* (2013.01); *H01L 41/257* (2013.01)

(58) Field of Classification Search
CPC ............. H01L 41/042; H01L 41/0472; H01L 41/257; H01L 41/0805; H01L 41/1876
See application file for complete search history.

(56) References Cited

U.S. PATENT DOCUMENTS 6,125,701 A * 10/2000 Sugitani ............. G01C 19/5607
73/504.16

2003/0016202 A1 * 1/2003 Edwards .............. G09G 3/2011
345/98
(Continued)

FOREIGN PATENT DOCUMENTS

JP          4-82309 A       3/1992
JP       2004-180496 A      6/2004
(Continued)

OTHER PUBLICATIONS

Foreign Office Action of JP 2012-205691 dated Mar. 3, 2015 with English translation.
(Continued)

*Primary Examiner* — Shawki S Ismail
*Assistant Examiner* — Muhammad S Islam
(74) *Attorney, Agent, or Firm* — Birch, Stewart, Kolasch & Birch, LLP

(57) ABSTRACT

A piezoelectric device, which has bipolar polarization-electric field (Pr-E) hysteresis characteristics of a piezoelectric material asymmetrically biased, when a first and second coercive electric fields respectively having smaller and larger absolute values are defined as Ec1 and Ec2 and a bias ratio of the coercive electric field is defined as [(Ec2+Ec1)/(Ec2−Ec1)]×100[%], includes a piezoelectric element unit including a piezoelectric body film whose bias ratio is 20% or more, the piezoelectric element unit operating with an electric field intensity smaller than that of the first coercive electric field. The piezoelectric device includes a refresh voltage applying circuit configured to apply a voltage to maintain operation performance of the relevant device, the voltage having an electric field intensity larger than the electric field intensity for operating the device and being equal to or less than three times |Ec1|, such that a polarized state of the piezoelectric body film is restored.

11 Claims, 10 Drawing Sheets

(51) Int. Cl.
    *H01L 41/257*     (2013.01)
    *H01L 41/047*     (2006.01)
    *H01L 41/08*     (2006.01)

(56) References Cited

U.S. PATENT DOCUMENTS

| | | | |
|---|---|---|---|
| 2003/0085965 A1* | 5/2003 | Yamada | B41J 2/09 347/77 |
| 2003/0179264 A1* | 9/2003 | Yamada | B41J 2/06 347/48 |
| 2004/0130584 A1* | 7/2004 | Kobayashi | B41J 2/09 347/11 |
| 2004/0135472 A1* | 7/2004 | Kita | G11B 5/5552 310/328 |
| 2004/0207676 A1* | 10/2004 | Yamada | B41J 2/0451 347/19 |
| 2011/0074888 A1* | 3/2011 | Fujii | B41J 2/04581 347/68 |
| 2011/0101828 A1* | 5/2011 | Noda | H01L 41/0478 310/348 |
| 2011/0156537 A1 | 6/2011 | Fujii | |
| 2011/0204750 A1* | 8/2011 | Fujii | H01L 41/094 310/330 |

FOREIGN PATENT DOCUMENTS

| | | |
|---|---|---|
| JP | 2004-338326 A | 12/2004 |
| JP | 2005-340631 A | 12/2005 |
| JP | 2007-40879 A | 2/2007 |
| JP | 2011-78203 A | 4/2011 |
| JP | 2011-138925 A | 7/2011 |
| JP | 2011-176038 A | 9/2011 |

OTHER PUBLICATIONS

International Preliminary Report on Patentability and English Translation of the Written Opinion of the International Searching Authority (Forms Forms PCT/IB/326, PCT/IB/338, PCT/IB/373 and PCT/ISA/237), dated Apr. 2, 2015, for International Application No. PCT/JP2013/074215.

International Search Report, issued in PCT/JP2013/074215, dated Nov. 26, 2013.

Written Opinion of the International Searching Authority, issued in PCT/JP2013/074215, dated Nov. 26, 2013.

* cited by examiner

RELATED ART

RELATED ART

RELATED ART

FIG.11

| | Nb AMOUNT (at%) | COERCIVE ELECTRIC FIELD Ec2 kV/cm | COERCIVE ELECTRIC FIELD Ec1 kV/cm | BIAS RATIO (Ec2+Ec1)/(Ec2−Ec1) ×100 | VALUE AT WHICH POLARIZATION DEGREE REACHES 80% AFTER POLARIZATION IN REVERSE DIRECTION (kV/cm) | REFRESH VOLTAGE (CASE OF 2μm) | DETERMINATION |
|---|---|---|---|---|---|---|---|
| COMPARATIVE EXAMPLE 2 | 0 | 51 | −48 | 3% | 60 | 12 | C |
| COMPARATIVE EXAMPLE 1 | 3 | 50 | −46 | 4% | 30 | 6 | C |
| EXAMPLE2 | 8 | 48 | −30 | 23% | 15 | 3 | A |
| EXAMPLE1 | 12 | 42 | −6 | 75% | 10 | 2 | A |

PIEZOELECTRIC DEVICE AND METHOD FOR USING SAME

CROSS-REFERENCE TO RELATED APPLICATIONS

This application is a Continuation of PCT International Application No. PCT/JP2013/074215 filed on Sep. 9, 2013, which claims priority under 35 U.S.C §119(a) to Japanese Patent Application No. 2012-205691 filed on Sep. 19, 2012. Each of the above applications is hereby expressly incorporated by reference, in their entirety, into the present application.

BACKGROUND OF THE INVENTION

1. Field of the Invention

The present invention relates to a piezoelectric device and a method for using the same, and in particular, relates to a structure of a device using a piezoelectric element which operates by use of a piezoelectric effect or inverse piezoelectric effect of a piezoelectric body film such as a piezoelectric actuator, an acceleration sensor, and an angular velocity sensor and to a method for maintaining an operation performance of the piezoelectric device.

2. Description of the Related Art

A piezoelectric actuator and piezoelectric sensor using a piezoelectric body film made of lead zirconate titanate (PZT) or the like have been widely known. A PZT film of related art has needed to undergo a polarization treatment in a manufacturing process of a device for obtaining a predetermined piezoelectric performance. Japanese Patent Application Laid-Open No. 4-082309 (PTL 1) discloses that heating (aging) is performed in a manufacturing stage of piezoelectric components to polarize a piezoelectric body used for the piezoelectric components to be subjected to a treatment with an applied voltage of two to two and a half times that of a coercive electric field (claim 1 in PTL 1). PTL 1 also describes that the applied voltage equal to or more than three times that of the coercive electric field is needed in general as a condition for the polarization treatment of a piezoelectric material (on the right-hand section in page 1 of PTL 1).

Japanese Patent Application Laid-Open No. 2007-040879 (PTL 2) describes a method for polarizing a vibrator for piezoelectric vibrating gyro. PTL 2 proposes that a high electric field is applied between electrodes to treat polarization in the air (claims 2 and 3 in PTL 2).

Japanese Patent Application Laid-Open No. 2005-340631 (PTL 3) describes that piezoelectric element components are treated with polarization at a temperature higher than a reflow temperature (claim 1 in PTL 3).

Japanese Patent Application Laid-Open No. 2011-078203 (PTL 4) proposes a piezoelectric actuator using a piezoelectric body film which has polarization characteristics of an asymmetric bipolar polarization-electric field curve (Pr-E hysteresis) and a driving method thereof.

SUMMARY OF THE INVENTION

If the piezoelectric material of related art as described in PTLs 1 to 3 is subjected to a solder reflow stage or the like after a device is made, the piezoelectric body film is depolarized (decreased in polarization). For this reason, it has been necessary that a process stage of reflow or the like is proceeded at a temperature as low as possible to minimize characteristic degradation of the piezoelectric body or that the polarization treatment is conducted again after the reflow or other high temperature processes.

On the other hand, as described in PTL 4, a PZT film doped with Nb has a good piezoelectric constant without undergoing the polarization treatment (in a no polarization treatment state) (PTL 4). This material is not easily depolarized even if heated, and therefore advantageously easy to handle without restrictions on temperature in processes after film formation.

However, even the device using the Nb-doped PZT film may be depolarized to not fully exert performance thereof in some cases where a plasma treatment is conducted toward depolarization in a middle process, an electric field in a reverse polarization direction is unintentionally applied (e.g., electrostatic chuck in a vacuum apparatus), or a degradation occurs under a usage environment at a high temperature or due to a long time usage, for example.

PTL 4 also proposes the driving method of an actuator in which a drive voltage having an electric field intensity sufficiently larger than the coercive electric field of the piezoelectric body film is applied, but does not describe the driving method in a case of using as a sensor or driving with a fine potential. Further, PTL 4 does not describe relation between sensor driving and reflow having asymmetric polarization characteristics.

The present invention has been made in consideration of such a circumstance and has an object to provide, with focusing on the above problems, a highly reliable piezoelectric device capable of ensuring a stable operation performance and a method for using the piezoelectric device which eliminates need for a polarization treatment with high voltage application which has been required in related art and prevents polarization degradation due to the usage environment or with time.

The invention described below is provided in order to achieve the above object.

(First aspect): A piezoelectric device according to the first aspect is a piezoelectric device operating by a piezoelectric effect and an inverse piezoelectric effect of a piezoelectric body film, including a piezoelectric element unit and a refresh voltage applying circuit, in which bipolar polarization-electric field (Pr-E) hysteresis characteristics of a piezoelectric material are asymmetrically biased with respect to an axis of a zero electric field, and when a first coercive electric field having smaller absolute value is defined as Ec1 and a second coercive electric field having larger absolute value is defined as Ec2 of coercive electric fields in the piezoelectric material, and when a bias ratio of the coercive electric field is defined as $[(Ec2+Ec1)/(Ec2-Ec1)]\times100[\%]$, the piezoelectric element unit includes the piezoelectric body film whose bias ratio of the coercive electric field is equal to or more than 20%, and operates with an electric field intensity smaller than that of the first coercive electric field, and the refresh voltage applying circuit applies a voltage in order to restore a polarized state of the piezoelectric body film and maintain operation performance of the piezoelectric device, the voltage having an electric field intensity larger than the electric field intensity for the operating and being equal to or less than three times the absolute value |Ec1| of the first coercive electric field.

According to this aspect, it is unnecessary to perform a polarization treatment with high voltage application which has been required in related art, and even if depolarization occurs due to a usage environment or with time, the polarized state can be restored by voltage application of a relatively low voltage. This allows device performance to be maintained/restored, ensuring stable operation performance.

(Second aspect): In the piezoelectric device described in the first aspect, it is preferable that the bias ratio of the piezoelectric body film is equal to or more than 70%.

The larger the bias ratio is, the smaller a value of the first coercive electric field becomes. According to such an aspect, a restoration treatment (refresh treatment) for the polarized state can be performed with a lower voltage.

(Third aspect): The piezoelectric device described in the first aspect or the second aspect may have a structure including at least one circuit of a drive circuit configured to supply a drive voltage for driving the piezoelectric element unit to the piezoelectric element unit, and a detection circuit configured to detect a voltage signal obtained from the piezoelectric element unit.

An actuator device includes a piezoelectric element operating by use of the inverse piezoelectric effect and the drive circuit for the element. A sensor device includes the piezoelectric element operating by use of the piezoelectric effect and the detection circuit for the element. There is also a structure including, depending on kinds of the sensor device, the piezoelectric element unit in which a piezoelectric element for drive operating by use of the inverse piezoelectric effect and a piezoelectric element for detection operating by use of the piezoelectric effect are combined, the drive circuit and the detection circuit.

(Fourth aspect): The piezoelectric device describe in the third aspect may have a structure in which the refresh voltage applying circuit is installed in at least one circuit of the drive circuit and the detection circuit.

A circuit structure may be such that a function of outputting the refresh voltage is installed in the drive circuit or the detection circuit.

(Fifth aspect): In the piezoelectric device described in the third aspect or the fourth aspect, an electronic circuit unit may include at least one circuit of the drive circuit and the detection circuit, and the refresh voltage applying circuit is constituted by an integrated circuit.

For example, the electronic circuit unit can be constituted by an ASIC (Application Specific Integrated Circuit).

(Sixth aspect): In the piezoelectric device described in any one of the first aspect to the fifth aspect, it is preferable that a magnitude of a voltage supplied from the refresh voltage applying circuit to the piezoelectric element unit is equal to or less than 5V.

With ASIC design taken into account, a magnitude of the refresh voltage is preferably equal to or less than 5V, more preferably equal to or less than 3V, further preferably equal to or less than 1.5V.

(Seventh aspect): The piezoelectric device described in any one of the first aspect to the sixth aspect may have a structure in which the piezoelectric element unit has a laminated structure in which a first electrode, the piezoelectric body film, and a second electrode are laminated, and the refresh voltage applying circuit applies a minus voltage to the second electrode when the first electrode is grounded.

A polarity of the applied voltage can be adequately selected depending on a polarization direction of the piezoelectric body film, and, for example, in a piezoelectric element structure in which a lower electrode (corresponding to the first electrode), the piezoelectric body film, and an upper electrode (corresponding to the second electrode) are laminated on a substrate, a structure may be used in which the lower electrode is grounded and a minus voltage is applied to the upper electrode to conduct the refresh treatment (treatment for restoring a polarized state).

(Eighth aspect): The piezoelectric device described in any one of the first aspect to the seventh aspect may have a structure in which the piezoelectric body film is perovskite-type oxide.

(Ninth aspect): The piezoelectric device described in any one of the first aspect to the eighth aspect may have a structure in which the piezoelectric body film is formed of one kind or plural kinds of perovskite-type oxide expressed by a general formula (P-1) below (which may contain inevitable impurities).

$$Pb_a(Zr_{b1}Ti_{b2}X_{b3})O_3 \qquad \text{general formula (P-1)}$$

(in the formula (P-1), X is at least one kind of metal element selected from element groups of a V group and a VI group; a>0, b1>0, b2>0, b3≥0; while a≥1.0 and b1+b2+b3=1.0 as a standard, these numerical values may include a tolerance from 1.0 in a range where a perovskite structure can be taken).

Such materials show good piezoelectric characteristics and are preferable in a device for a sensor purpose or actuator purpose.

(Tenth aspect): In the piezoelectric device described in the ninth aspect, it is preferable that X of the piezoelectric body film is Nb, b3 is equal to or more than 0.05 and equal to or less than 0.3.

(Eleventh aspect): In the piezoelectric device described in the ninth aspect or the tenth aspect, it is preferable that X of the piezoelectric body film is at least one kind of metal element of Nb and Bi.

(Twelfth aspect): In the piezoelectric device described in any one of the ninth aspect to the eleventh aspect, it is preferable that a is equal to or more than 1.1 in the general formula (P-1) for the piezoelectric body film.

(Thirteenth aspect): The piezoelectric device described in any one of the first aspect to the twelfth aspect may have a structure in which the piezoelectric element unit includes a piezoelectric element for drive operating by the inverse piezoelectric effect and a piezoelectric element for detection operating by the piezoelectric effect, and the piezoelectric device includes a control unit configured to apply a voltage to the piezoelectric element unit from the refresh voltage applying circuit in a case where a detection voltage is lower than a reference value, the detection voltage being output from the piezoelectric element for detection when the piezoelectric element for drive is driven with a predetermined drive voltage.

According to such an aspect, performance degradation due to depolarization can be automatically determined to control whether or not the refresh treatment is required to be conducted, keeping a constant device performance.

(Fourteenth aspect): A method for using a piezoelectric device according to the fourteenth aspect is a method for using a piezoelectric device which is operated by use of at least one of a piezoelectric effect and an inverse piezoelectric effect of a piezoelectric body film and with an electric field intensity smaller than that of a first coercive electric field, in which bipolar polarization-electric field (Pr-E) hysteresis characteristics of a piezoelectric material are asymmetrically biased with respect to an axis of a zero electric field, and a first coercive electric field having smaller absolute value is defined as Ec1 and a second coercive electric field having larger absolute value is defined as Ec2 of coercive electric fields in the piezoelectric material, and a bias ratio of the coercive electric field is defined as [(Ec2+Ec1)/(Ec2−Ec1)]×100[%], a piezoelectric body film whose bias ratio of the coercive electric field is equal to or more than 20% is used, and a voltage is applied in order to maintain operation performance of the piezoelectric device, the voltage having an electric field intensity larger than the electric field intensity for the operating and being equal to or less than three times an absolute value |Ec1| of the first coercive electric field, such that a polarized state of the piezoelectric body film is restored.

According to this method, the performance degradation of the piezoelectric device due to the depolarization can be prevented, maintaining the operation performance of the device to ensure stable performance.

According to the invention, the need for the polarization treatment with high voltage application which has been required in related art is eliminated and the polarization degradation due to the usage environment or with time can be prevented, maintaining the device performance. This makes it possible to provide a highly stable and reliable piezoelectric device.

BRIEF DESCRIPTION OF THE DRAWINGS

FIG. 11 is a table summarizing results obtained from Examples 1 and 2, and Comparative Examples 1 and 2.

DETAILED DESCRIPTION OF EXEMPLARY EMBODIMENTS

Hereinafter, a description is given of embodiments of the present invention in detail with reference to the accompanying drawings.

Figure 1:
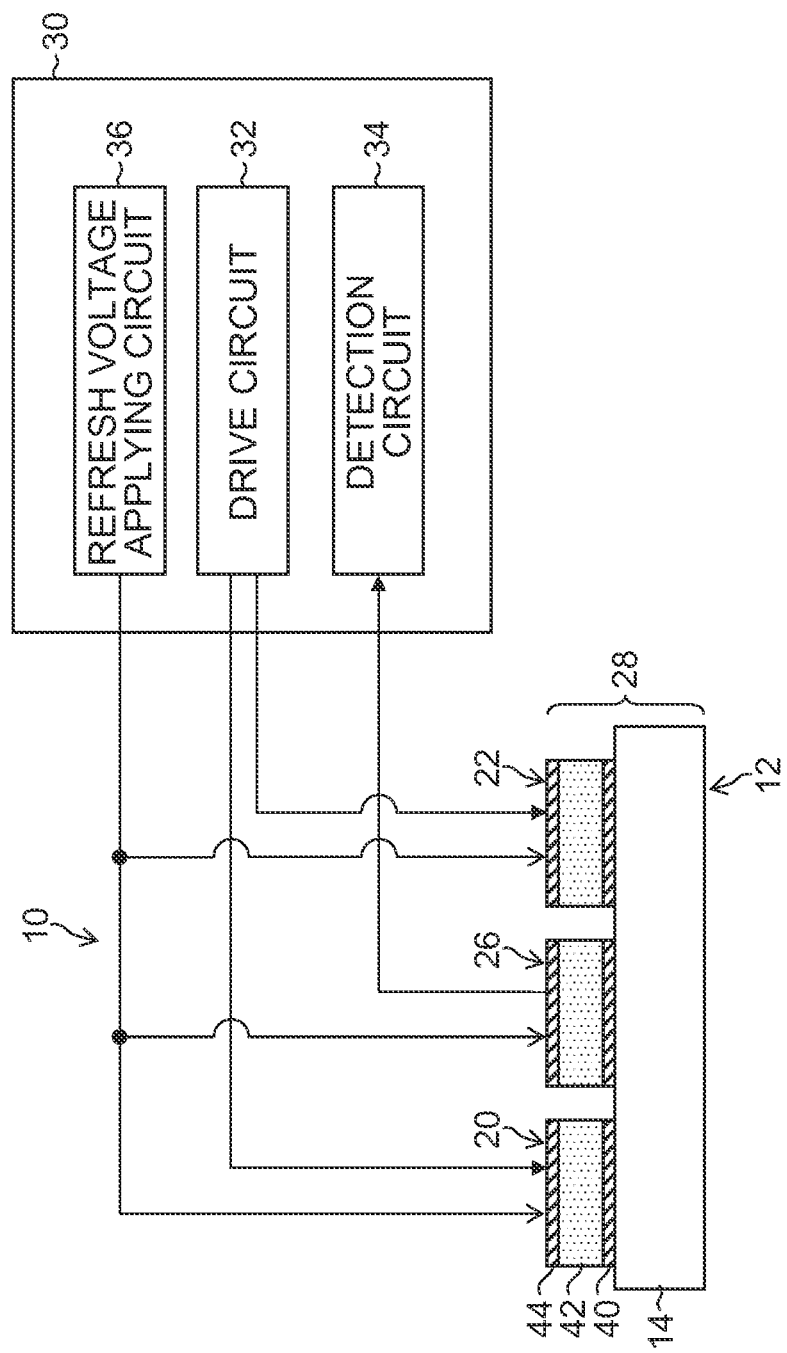
FIG. 1 is a diagram illustrating an exemplary structure of a piezoelectric device according to an embodiment of the invention.

FIG. 1 is a diagram illustrating an exemplary structure of a piezoelectric device according to an embodiment of the invention. There is illustrated a structure of a main part of a sensor device used as a gyro sensor or an angular velocity sensor. The piezoelectric device 10 includes a sensor element unit 28 (corresponding to "piezoelectric element unit") having piezoelectric elements for drive 20 and 22 and a piezoelectric element for detection 26 provided on a substrate 14 constituting a vibrating part 12. The piezoelectric device 10 also includes an electronic circuit unit 30 electrically connected with the sensor element unit 28. The piezoelectric device 10 can be configured as a sensor unit (covered by a packaging member not illustrated) packaged to include the sensor element unit 28 and the electronic circuit unit 30.

The piezoelectric elements for drive 20 and 22 in the sensor element unit 28 which use an inverse piezoelectric effect to operate, convert an electrical signal (drive voltage) into mechanical stress. The piezoelectric element for detection 26 which uses a piezoelectric effect to operate converts the mechanical stress into the electrical signal.

The electronic circuit unit 30 includes a drive circuit 32 supplying the drive voltage to the piezoelectric elements for drive 20 and 22, a detection circuit 34 detecting a voltage signal (detection voltage) obtained from the piezoelectric element for detection 26, and a refresh voltage applying circuit 36 supplying a voltage for refresh treatment (polarization restoring treatment) (referred to as "refresh voltage" in the description) to the piezoelectric elements 20, 22, and 26 for keeping/restoring a polarized state in order to maintain operation performance of the device.

The electronic circuit unit 30 can be constituted by an integrated circuit represented by an ASIC (Application Specific Integrated Circuit). In FIG. 1, for the purpose of illustration, the drive circuit 32, the detection circuit 34, and the refresh voltage applying circuit 36 are illustrated as a separate block respectively, but the drive circuit 32 may have a refresh voltage applying function installed therein, and the detection circuit 34 may have a refresh voltage applying function installed therein.

The piezoelectric elements 20, 22, and 26 in the sensor element unit 28 have a laminated structure in which a lower electrode 40 (corresponding to "first electrode"), a piezoelectric body film 42, and an upper electrode 44 (corresponding to "second electrode") are laminated sequentially in this order on the substrate 14 as a support layer toward. Film thicknesses of individual layers and ratios thereof illustrated in FIG. 1 or other drawings are adequately changed, for convenience of description, not necessarily reflect an actual film thickness and ratio. In the description, in representing the laminated structure, a direction away from a surface of the substrate 14 in a substrate thickness direction is referred to as an "upper direction". In the structure illustrated in FIG. 1, in a state where the substrate 14 is horizontally held, the lower electrode 40, piezoelectric body film 42, and upper electrode 44 are sequentially overlaid on an upper surface of the substrate 14, coinciding with a upward and downward relationship in a case where the gravity direction (downward direction in FIG. 1) is defined as a lower direction. However, an attitude of the substrate 14 may be inclined or inverted. Even in a case where a lamination direction in the laminated structure depending on the attitude of the substrate 14 does not necessarily coincide with the upward and downward direction on the basis of the gravity direction, a direction away from the surface of the substrate 14 in the thickness direction with respect to the relevant surface is represented as the "upper direction" in order to represent the upward and downward relationship in the laminated structure without complexity. For example, even in a case where the upward and downward directions are inverted in FIG. 1, a description is made by representation that the lower electrode 40 is formed on the substrate 14 and the piezoelectric body film 42 is laminated on top of the lower electrode 40.

Materials of the substrate 14 are not particularly limited, and there may be used, for example, silicon (Si), silicon oxide, glass, stainless (SUS), yttria-stabilized zirconia (YSZ), alumina, sapphire, SiC, and $SrTiO_3$. As the substrate 14, a laminated substrate such as an SOI (Silicon on Insulator) substrate may be used in which a $SiO_2$ film and a Si active layer are sequentially laminated on a silicon substrate.

A composition of the lower electrode 40 or the upper electrode 44 is not particularly limited, and there may be used, for example, metals such as Au (gold), Pt (platinum), Ag (silver), Ir (iridium), Al (aluminum), Mo (molybdenum), Ru (ruthenium), TiN (titanium nitride), $IrO_2$, $RuO_2$, $LaNiO_3$, and $SrRuO_3$, or metal oxides of these metals, and combinations thereof.

The lower electrode 40 preferably has a structure containing platinum group metals particularly of these metals. Ti, TiW and the like are preferably used as an adhesive layer in the structure to improve adhesiveness to the substrate 14, and an aspect is more preferably in which platinum group metals are laminated on the adhesive layer to form the electrode.

The upper electrode 44 is electrically connected by use of wire bonding, an anisotropic conductive film (ACF) or the like with ASIC (electronic circuit unit 30) or other electronic circuits (including a lead wiring pattern or the like). For this reason, an uppermost layer (outermost surface layer) of the upper electrode 44 is preferably made of materials excellent in wire bondability. As a condition for this, a metal having a relatively low melting point is preferable. A metal having the melting point of 1500 degrees or less is preferable as a guide, and for example, a structure containing any of Al, Au, Ti, Cu, Cr, and Ni is preferable.

Modification Example 1 Concerning Device Structure

FIG. 1 illustrates a form where the respective piezoelectric elements 20, 22, and 26 are individually isolatedly-processed in element units showing the structure of the lower electrode 40, the piezoelectric body film 42, and the upper electrode 44 being isolated in element units, but a form may be used in which the lower electrode 40 and the piezoelectric body film 42 are not individually isolatedly-processed for each element. For example, a lower electrode can be common in the plural piezoelectric elements 20, 22, and 26 illustrated in FIG. 1 (non-patterned common electrode layer). The piezoelectric body film 42 may be also constituted as a one body piezoelectric body film not individually isolatedly-processed for the plural piezoelectric elements 20, 22, and 26 (e.g., see FIG. 1 and FIG. 3 in PTL 2). Patterning (isolatedly forming) the upper electrode 44 corresponding to the piezoelectric elements 20, 22, and 26 makes portion of the piezoelectric body film 42 function as a piezoelectric active part, the piezoelectric body film 42 being sandwiched between the upper electrode 44 and the lower electrode 40 facing the upper electrode 44.

Modification Example 2 Concerning Device Structure

FIG. 1 illustrates the structure in which two the piezoelectric elements for drive 20 and 22 and one piezoelectric element for detection 26 are combined as the sensor element unit 28, but the number of the piezoelectric elements, whether or not the elements for drive and for detection are combined, a ratio of the numbers of those combined, and an arrangement of the piezoelectric elements are not limited to this example, and various designs may be made depending on purposes or specifications of the device. For example, a tuning fork-shaped gyro sensor (FIG. 3 and FIG. 4) described later includes the plural vibrating parts 12 having the structure illustrated in FIG. 1. A form may be used in which an electrode for drive is arranged in a center portion and electrodes for detection are arranged on both sides thereof, like the gyro sensor described in PTL 2.

The above modifications can be applied to various piezoelectric devices regardless of the structure thereof.

Alternatively, a piezoelectric sensor device may be used in a form in which the piezoelectric elements for drive 20 and 22 and the drive circuit 32 are omitted from the structure in FIG. 1. A piezoelectric actuator device may be used in a form in which the piezoelectric element for detection 26 and the detection circuit 34 are omitted from the structure in FIG. 1.

<Piezoelectric Material>

As the piezoelectric body film 42, a piezoelectric body film formed of one kind or plural kinds of perovskite-type oxide expressed by a general formula (P-1) below is used (which may contain inevitable impurities).

$$Pb_a(Zr_{b1}Ti_{b2}X_{b3})O_3 \quad \text{(P-1)}$$

In the formula (P-1), X is at least one kind of metal element selected from element groups of the V group and the VI group; a>0, b1>0, b2>0, b3≥0; while a≥1.0 and b1+b2+b3=1.0 as a standard, these numerical values may include a tolerance from 1.0 in a range where a perovskite structure can be taken. The embodiment is not limited to the case of a≥1.0. The embodiment is also not limited to the case of (b1+b2+b3)=1.0. So long as the perovskite-type oxide contained in the piezoelectric body film is in the range where the perovskite structure can be taken, a may be less than 1.0, and a tolerance may exist between a value of (b1+b2+b3) and 1.0.

The perovskite-type oxide expressed by the general formula (P-1) is lead zirconate titanate (PZT) when b3=0, and an oxide with a part of the B site of PZT being substituted by X that is at least one kind of metal element selected from element groups of the V group and the VI group when b3>0.

X may be any metal element of the VA group, VB group, VIA group, and VIB group, and is preferable at least one kind selected from the group consisting of V, Nb, Ta, Cr, Mo, W, and Bi.

It has been known that PZT to which various donor ions having a valence higher than a valence of substituted ion are added, is improved more than the intrinsic PZT in characteristics such as the piezoelectric performance.

For example, when X is Nb, b3 is preferably equal to or more than 0.05 and equal to or less than 0.3.

As a specific example of the piezoelectric body film 42 in the embodiment, for example, a lead zirconate titanate (PZT) thin film doped with 12% in atomic composition percentage of Nb can be used. Film formation using PZT doped with 12% of Nb by the sputtering method or the like makes it possible to stably manufacture a thin film having piezoelectric characteristics of piezoelectric constant as high as d31=250 pm/V. A bulk piezoelectric body may be bonded to the substrate to be polished, but in this method, the piezoelectric body is difficult to be made into a thin film, reducing displacement. Further, a yield is disadvantageously low due to crash in polishing or the like. In consideration of these disadvantages, a structure is preferable in which a piezoelectric thin film is directly formed on the substrate by the chemical vapor deposition, sol-gel method or the like. Particularly, the piezoelectric body film 42 in the embodiment is preferably a thin film having the film thickness of 5 μm or less. The thinner the film thickness, the more the applied voltage can be lowered, and thus, more preferably the film thickness is equal to or less than 3 μm. In a preliminary experiment or Example 1 described later, a piezoelectric thin film of 2 μm thickness formed by the sputtering method is used as the piezoelectric body film, but not limited thereto. The film thickness of the piezoelectric body film may be 1 μm to 1.5 μm.

<Film Formation Method>

The film formation method of the piezoelectric body film 42 is preferably the chemical vapor deposition. For example, in addition to the sputtering method, various methods may be applied, such as ion plating method, MOCVD (metal-organic chemical vapor deposition), and PLD (pulse laser deposition). Methods other than the chemical vapor deposition (e.g., sol-gel method and the like) may be considered to be used.

A description is given of an example using the PZT film doped with Nb in the embodiment. Hereinafter, the piezoelectric body film 42 may be referred to as the "Nb-doped PZT film" in some cases.

<Characteristics of Piezoelectric Body Film>

Figure 2:
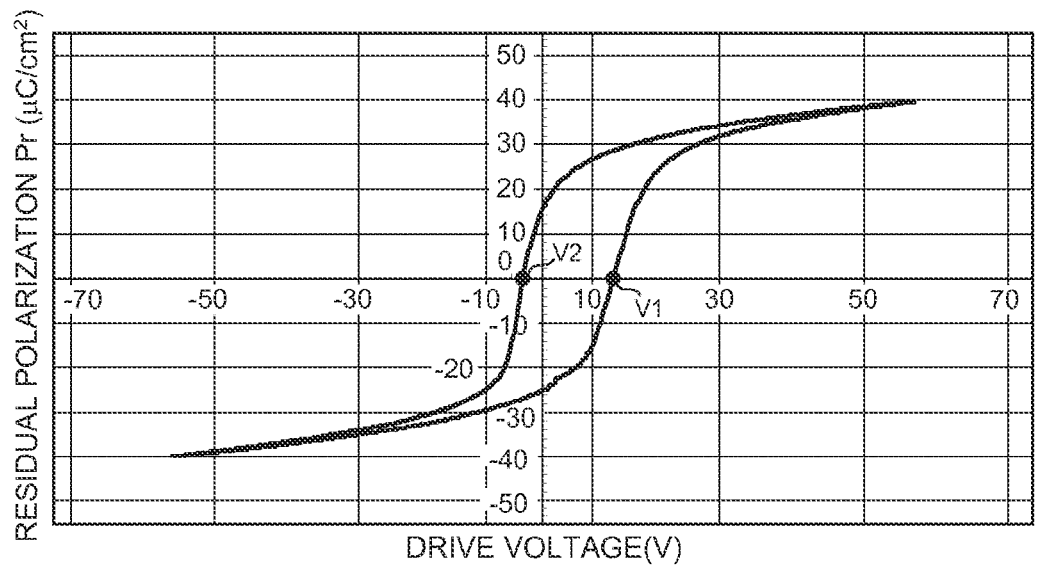
FIG. 2 is a graph illustrating an example of bipolar polarization-electric field hysteresis (Pr-E hysteresis) characteristics of a piezoelectric body film.

FIG. 2 illustrates bipolar polarization-electric field hysteresis (Pr-E hysteresis) characteristics of the piezoelectric body film 42. In FIG. 2, an abscissa axis represents the drive voltage (electric field) and an ordinate axis represents polarization. The drive voltage of the abscissa axis is expressed by a product of a thickness of the piezoelectric body film in a voltage application direction and the electric field, and therefore, a value of the electric field is found by dividing a value of the drive voltage by the thickness of the piezoelectric body. In FIG. 2, "V1" is a product of a coercive electric field on a positive electric field side and the thickness of the piezoelectric body film in the voltage application direction, and "V2" is a product of a coercive electric field on a negative electric field side and the thickness of the piezoelectric body film in the voltage application direction.

As illustrated in FIG. 2, the Nb-doped PZT film has Pr-E hysteresis characteristics having coercive electric field points on each of the negative electric field side and the positive electric field side and asymmetric with respect to a y axis representing residual polarization (position of a zero electric field) (that is, biased to the positive electric field side). In FIG. 2, a coercive electric field Ec1 on the negative electric field side and a coercive electric field Ec2 on the positive electric field side has a relation of |Ec1|<Ec2. The piezoelectric body film having the asymmetric Pr-E hysteresis thus biased to the positive electric field side is less prone to be polarized when the positive electric field is applied because of large coercive electric field Ec2, and is prone to be polarized when the negative electric field is applied because of small absolute value of the coercive electric field Ec1.

In other words, the drive by applying the electric field on either one polarity side of the positive and negative coercive electric fields which has smaller absolute value of a coercive electric field value (drive by applying a minus electric field in the case of FIG. 2) allows larger piezoelectric performance to be obtained. The piezoelectric device 10 formed using the piezoelectric material having a bias of the P-E hysteresis characteristics as illustrated in FIG. 2 operates the piezoelectric element in a range of value smaller than that of the coercive electric field (Ec1) which has smaller absolute value.

Assuming that "bias ratio" of the Pr-E hysteresis is defined by [Formula 1] below, the bias ratio of the P-E hysteresis illustrated in FIG. 2 is about 75%.

[Formula 1]

$$[(Ec2+Ec1)/(Ec2-Ec1)] \times 100(\%) \quad (1)$$

In this way, the piezoelectric body film 42 having a Pr-E hysteresis curve of a shape generally biased rightward (to the positive electric field side) is polarized in advance with no polarization treatment made.

In the embodiment, because of the Pr-E hysteresis characteristics biased to the positive electric field side, a value calculated from [Formula 1] is the "bias ratio", but, oppositely to this, in the case of the piezoelectric body having the Pr-E hysteresis characteristics biased to the negative electric field side, the bias ratio is an absolute value of a value obtained from [Formula 1].

In the case of the Pr-E hysteresis characteristics biased to the positive electric field side, a direction of the drive voltage is opposite to a direction in the case of the Pr-E hysteresis characteristics biased to the negative electric field side.

The bias ratio of the Pr-E hysteresis correlates with an Nb doped amount in the piezoelectric body film (i.e., a doped amount of "X" element in the general formula (P-1)). The more the doped amount of the element such as Nb or Bi increases, the more the bias ratio increases. The more an amount of "Pb" in the general formula (P-1), the more the bias ratio shows a tendency to increase. A state of excessive Pb is preferable where the value of "a" in the general formula (P-1) is equal to or more than 1.1.

An upper limit of the Nb amount in the piezoelectric material is determined in terms of whether or not the piezoelectric body film suitable for practice can be formed. In general, when the Nb doped amount is increased, the piezoelectric performance is improved, but when the Nb doped amount is excessively increased, cracks tend to be likely to be generated in relation to stress. If the film thickness is thin, the cracks are not likely to be generated, and therefore, the Nb doped amount is determined also depending on the film thickness of the piezoelectric body film used in practice. In a case of the piezoelectric actuator or piezoelectric sensor on an assumption of application to general electronic equipment such as a mobile phone or an ink-jet printer, the film thickness of the piezoelectric body film is roughly about 1 μm to 5 μm and the upper limit of the Nb doped amount is roughly about 20 at % (atomic composition percentage; at %). In other words, the Nb doped amount for the piezoelectric body film 42 is preferably equal to or more than 6 at % and equal to or less than 20 at %.

<Preliminary Experiment Description>

A lower electrode was formed on an SOI wafer as the substrate 14 and a PZT doped with 12% Nb (Nb-doped PZT) having a thickness of 2 μm was formed to be overlaid on the lower electrode. Further, an upper electrode was formed on the Nb-doped PZT film, and a processing for an intended device shape was done by way of a semiconductor processing process such as dry etching to produce an angular velocity sensor element (gyro sensor) for preliminary experiment.

Figure 3:
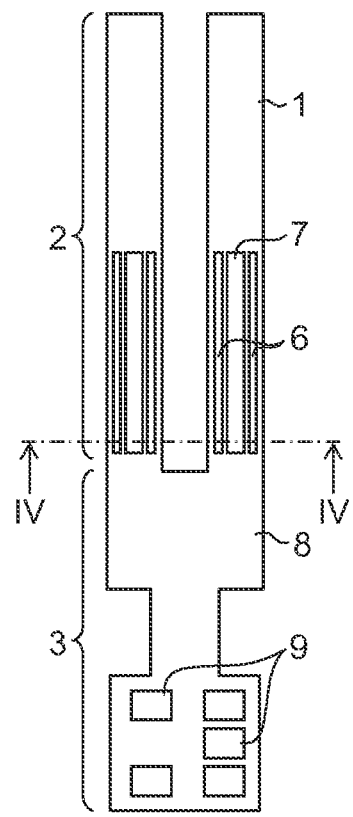
FIG. 3 is a plan view of a manufactured gyro sensor.
Figure 4:
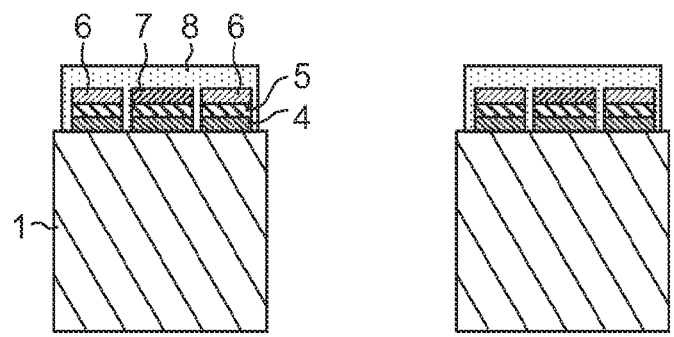
FIG. 4 is an enlarged sectional view along a line IV-IV of FIG. 3.

FIG. 3 is a plan view of the gyro sensor produced for the preliminary experiment, and FIG. 4 is an enlarged sectional view along line IV-IV of FIG. 3. The gyro sensor has the same structure as that disclosed in Japanese Patent Application Laid-Open No. 2011-59125. FIG. 3 and FIG. 4 are the figures incorporating FIG. 1 and FIG. 2 in the relevant Japanese Patent Application, and reference numerals in the figures used herein are the same numerals in the relevant Japanese Patent Application. The reference numeral 1 designates a substrate; 2, a vibrating part; and 3, a fixing part supporting the vibrating part 2. The reference numeral 4 designates a lower electrode; 5, a piezoelectric body; 6, a drive electrode; 7, a detection electrode; 8, a protective film;

and 9, a connection electrode for connecting with an external electric circuit (not illustrated in FIG. 3, and corresponding to the electronic circuit unit 30 in FIG. 1).

The substrate 1, vibrating part 2, lower electrode 4, and piezoelectric body 5 in FIG. 3 correspond to the substrate 14, vibrating part 12, lower electrode 40, and piezoelectric body film 42 in FIG. 1, respectively. The drive electrodes 6 in FIG. 3 correspond to the upper electrodes of the piezoelectric elements for drive 20 and 22 in FIG. 1, and the detection electrode 7 in FIG. 3 corresponds to the upper electrode of the piezoelectric element for detection 26 in FIG. 1.

As is described in Japanese Patent Application Laid-Open No. 2011-59125, this gyro sensor includes the vibrating parts 2 as a pair of two square poles and the fixing part 3 supporting the vibrating part 2, and an upper surface of each vibrating part 2 has two drive electrodes 6 and one detection electrode 7 formed thereon.

By applying an AC voltage to two drive electrodes 6 of each vibrating part 2, a bending motion can be generated at an eigenfrequency. With some effort such as by shifting phases of the voltage applied to two drive electrodes 6 in one vibrating part 2 by 180 degrees, the vibrating parts 2 can be excited in right and left directions on paper in FIG. 3. Two vibrating parts 2 are vibrated not substantially in parallel but vibrated so that they open and close. During such a vibration, if the relevant gyro sensor is brought into angular velocity motion about an axis parallel to a longitudinal direction of the vibrating part 2, the vibrating part 2 is distorted by Coriolis force, which generates an electrical potential in the detection electrode 7. This signal is treated to be amplified by an external circuit to allow the angular velocity to be detected.

(Preliminary Experiment 1)

For examining a polarization degree of the produced gyro sensor, the relevant produced device, with no initial polarization treatment made, was driven by applying a drive voltage of 0.14V to the drive electrode 6 while detecting an output voltage acquired from the detection electrode 7. With a voltage (refresh voltage) applied to the detection electrode being changed, the voltages output were plotted and normalized with an output at the electric field intensity of −20V (−100 kV/cm) as "1".

Figure 5:
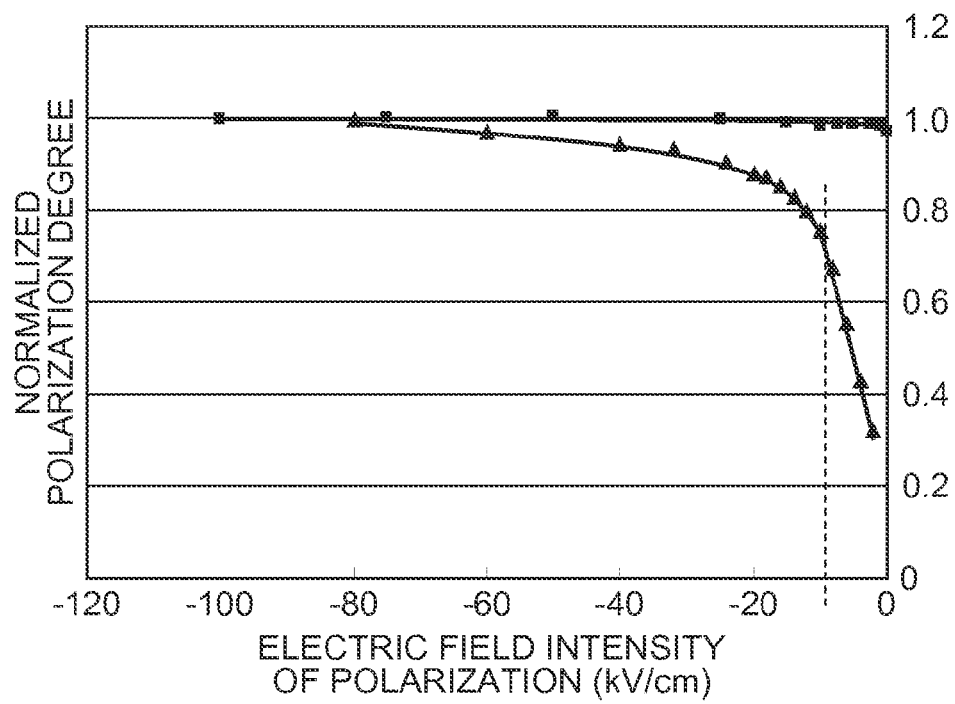
FIG. 5 is a graph summarizing results of a preliminary experiment.

A point expressed by a black square in FIG. 5 illustrates a plotted point of the polarization degree after normalization. From the result of the preliminary experiment 1, it was found out that the piezoelectric body film in this example is almost polarized with no polarization treatment being made (in a no polarization treatment state) (polarization is roughly uniformed in an initial state). In other words, use of the piezoelectric material like this eliminates the need for the polarization treatment which has been required in related art (initial polarization treatment for exerting the piezoelectric performance).

(Preliminary Experiment 2)

Next, the piezoelectric body film used in the preliminary experiment 1 was subjected to the polarization treatment in a reverse direction to conduct the same experiment. In other words, a voltage of +20V was applied for one minute in a direction reverse to the direction of the polarization obtained in the initial state, and thereafter, the same experiment as the above preliminary experiment 1 was conducted. This is the experiment in which the piezoelectric body film with the polarized state uniformed in the initial state (no polarization treatment state) is intentionally brought into a reverse polarized state in advance (corresponding to a depolarized state), to which film the refresh voltage is applied to examine whether or not the polarized state is restored. A plotted point expressed by a triangle in FIG. 5 illustrates the experiment result of the preliminary experiment 2.

According to FIG. 5, the polarization degree rapidly changes adjacent to an electric field of −10 kV/cm illustrated by a dotted line in the figure, and if the electric field having an electric field intensity of 10 kV/cm or more is applied, the polarization degree exceeds 0.8 (the polarized state is restored by 80% or more). In other words, it was found that if the electric field having an electric field intensity of less than 10 kV/cm is applied, the polarized state cannot be restored sufficiently, and unless the electric field having an electric field intensity of 10 kV/cm or more is applied, 80% or more of the polarization is not restored. This value of 10 kV/cm is a value sufficiently smaller than the electric field intensity required for the polarization treatment of the piezoelectric material of related art (intrinsic PZT). Note a polarization treatment duration was one minute, but actually, a voltage application duration for about one second is enough in the polarization treatment.

<Repolarization Treatment for Maintaining/Restoring Piezoelectric Device Performance>

The piezoelectric body film used in the embodiment has the polarized state uniformed in advance in the initial state (a film formed in the no polarization treatment state) as described above, in which necessary piezoelectric performance is achieved with no polarization treatment of related art made. However, in a process in processing the piezoelectric body film, various factors possibly cause depolarization. For example, if an electrostatic chuck absorbing a wafer is used, a large electric field is applied to a film surface to possibly cause the reverse polarization. Alternatively, an electrical potential is applied to the film surface due to exposure in plasma to possibly cause the reverse polarization under some conditions. Further, at least a risk of depolarization exists in a state of being exposed to a high temperature in a reflow treatment after the device is made.

If the piezoelectric device finished as a final commercial product is used as a device for long time, depolarization may occur even little by little depending on the method for using or the usage environment of the piezoelectric device. If the piezoelectric body film is depolarized, sensor sensitivity or actuator characteristics (i.e., operating characteristics as a device) are changed, causing some calibration to be required.

In order to prevent performance degradation due to the depolarization as above, the piezoelectric device in the embodiment has a function to apply the refresh voltage to the piezoelectric element for restoring the polarized state and to maintain the device performance.

<Comparison with Structure of Related Art>

(Method of Related Art)

Figure 6:
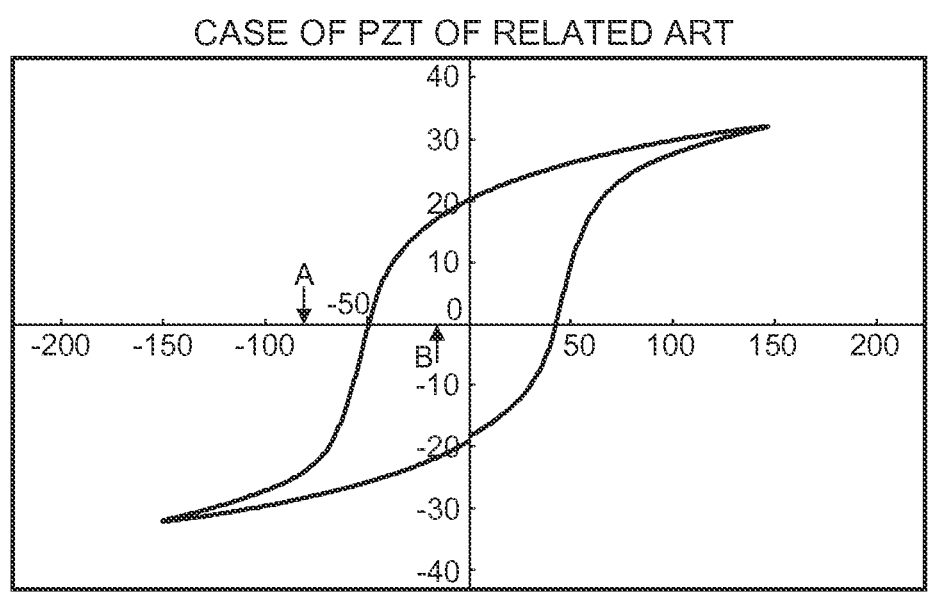
FIG. 6 is a graph illustrating Pr-E hysteresis characteristics of a piezoelectric body film of related art (intrinsic PZT).

FIG. 6 is a graph illustrating Pr-E hysteresis characteristics of the piezoelectric body film of related art (intrinsic PZT). An abscissa axis represents an electric field (in units of [kV/cm]) and an ordinate axis represents a residual polarization (in units of [$\mu C/cm^2$]). As illustrated in FIG. 6, the Pr-E hysteresis characteristics of the PZT film of related art is roughly symmetric with respect to an origin.

In a case where the piezoelectric element using the PZT film of related art like this is used as an ejection energy generating element for an inkjet printer, for example, as illustrated in FIG. 6 by an arrow A, an electric field slightly exceeding (absolute value thereof is larger) the coercive electric field on the negative electrode side is applied for driving. Even if such a drive voltage (electric field) is applied in a state where the depolarization occurs, the polarized state is not sufficiently restored (original polarized state is not restored). In other words, bringing the depolarized state back to the original polarized state requires application of the electric field (voltage) of two to three times as large as an absolute value of the coercive electric field (PTL 1).

On the other hand, for the purpose of the gyro sensor or the like driven by a fine voltage, as illustrated in FIG. 6 by an arrow B, the ASIC is used which is operated by very small electric field. The ASIC corresponding to the fine voltage like this cannot conduct the polarization treatment, and a voltage far larger than the drive voltage is required in order to conduct the polarization treatment.

Figure 7:
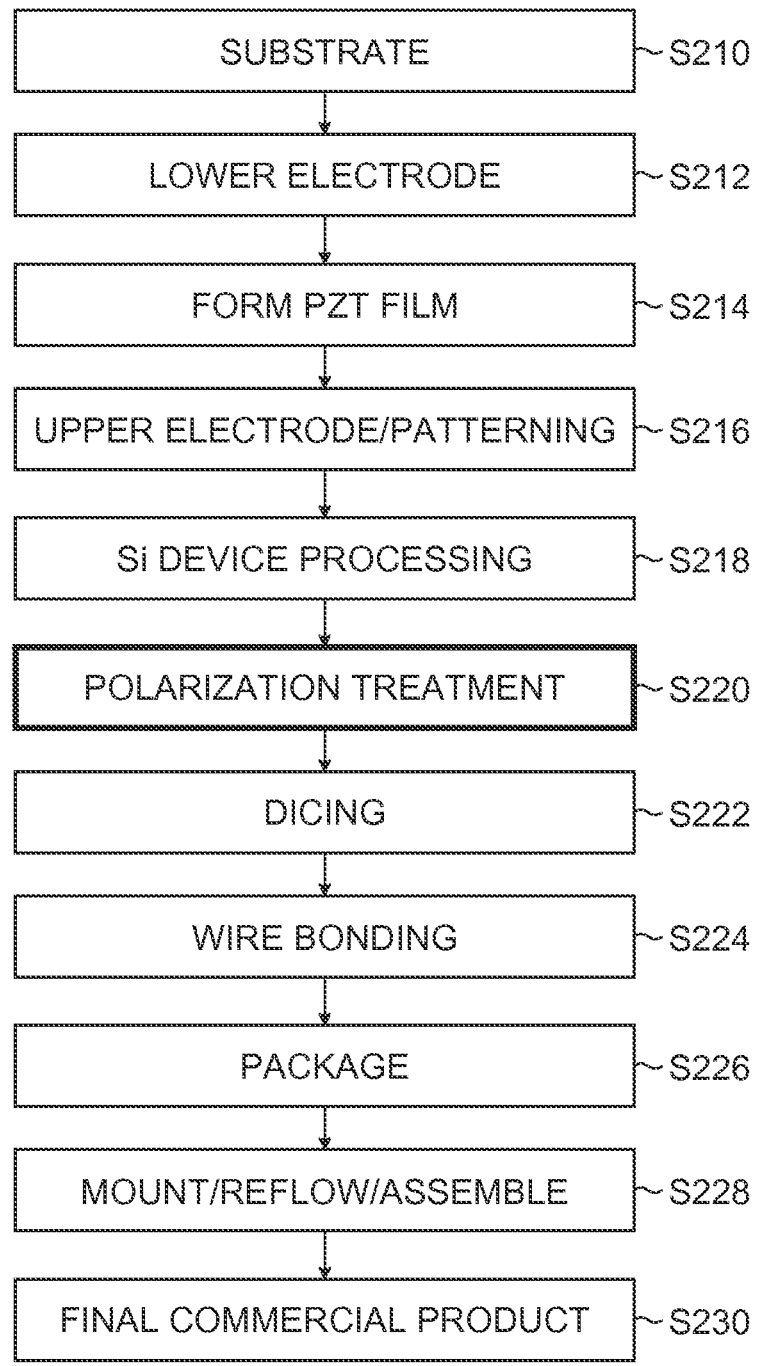
FIG. 7 is a flowchart illustrating a procedure of a manufacturing process for electronic equipment using the piezoelectric body film of related art (intrinsic PZT).
Figure 8:
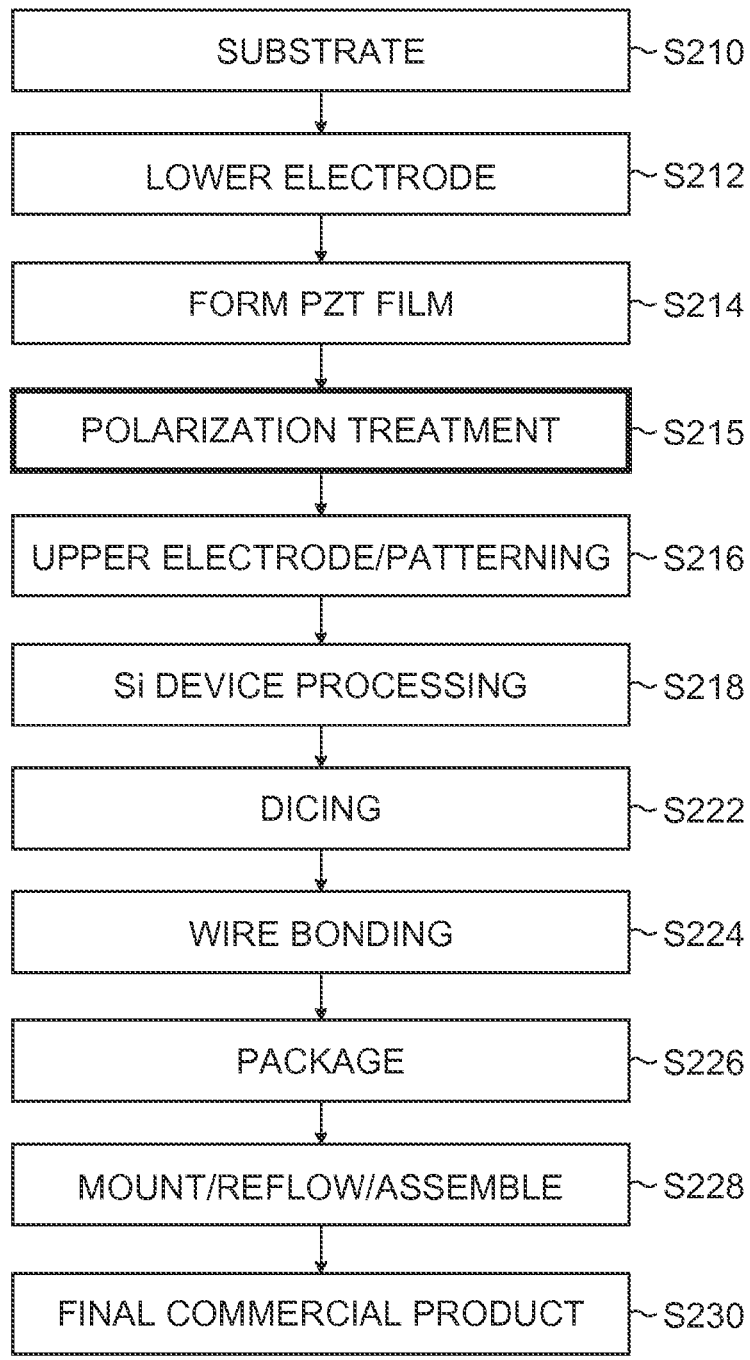
FIG. 8 is a flowchart illustrating a procedure of a manufacturing process for electronic equipment using the piezoelectric body film of related art (intrinsic PZT).

FIG. 7 and FIG. 8 each is a flowchart illustrating a procedure of a manufacturing process for electronic equipment using the piezoelectric film of related art (PZT). FIG. 7 illustrates a flow for conducting the polarization treatment after a silicon (Si) device is processed, and FIG. 8 illustrates a flow for conducting the polarization treatment immediately after the PZT film is formed.

In an example in FIG. 7, after the lower electrode is formed on the silicon (Si) substrate (steps S210 to S212), the PZT film is formed on the lower electrode (step S214). On the lower electrode, the upper electrode is formed and patterned to form a target laminated structure (step S216), and thereafter, a silicon layer is processed so as to have a desired shape and thickness (step S218). After that, the polarization treatment is conducted (step S220) to achieve the necessary polarized state. After the polarization treatment, isolation is performed by dicing from a wafer to individual element units (step S222), connection is made to an integrated circuit by wire bonding (step S224), and then packaging is performed (step S226). The packaged device is mounted on the electronic circuit board, which undergoes the solder reflow treatment (step S228). In this way, the electronic circuit board with the device installed therein is produced, which then undergoes an assembly stage to manufacture the final commercial product (electronic equipment) (step S230).

In FIG. 8, the stages same as or similar to the flow described in FIG. 7 are designated by the same step numbers. An example in FIG. 8, after the PZT film formation stage shown in step S214, the polarization treatment (step S215) is conducted, and then, the upper electrode forming and patterning stage (step S216) is performed. The subsequent treatment is same as those in FIG. 7.

As illustrated in FIG. 7 and FIG. 8, in the past, the polarization treatment (step S220 in FIG. 7, S215 in FIG. 8) has been conducted before the final commercial product (electronic equipment) is finished.

However, this has generated depolarization depending on the usage environment of the final commercial product (e.g., put under a high temperature, used for long time) to cause variations of the device performance. The polarization treatment conducted in a state of the final commercial product requires a large voltage application of tens of volts to hundreds of volts, which has a problem that such a high voltage supply is difficult in the ASIC for drive and may exceed a voltage resistance of wiring.

In general, the voltage in the ASIC for drive is preferably low for the purpose of mobile equipment such a mobile phone in relation to power consumption. The ASIC is different in its output voltage depending on the specification by each manufacturer and, for example, the ASIC of 5V or less is generally used for the purpose of mobile equipment. For this reason, if a voltage of 5V or more is applied in the relevant equipment at all, a special effort such a charge pump may be required, which causes cost increase. Further, an ASIC for outputting a high voltage may be increased in size, causing a problem.

Embodiments of the Invention

In contrast to this, in the embodiment, the piezoelectric body whose Pr-E hysteresis characteristics are asymmetrically biased is used as described in FIG. 2, and can undergo the polarization treatment with a voltage far lower than that of related art. Further, as described in FIG. 1, by installing the function for applying the refresh voltage into the electronic circuit unit 30 of the final product, a stable performance can be exerted for a long time independently of the usage environment.

Figure 9:
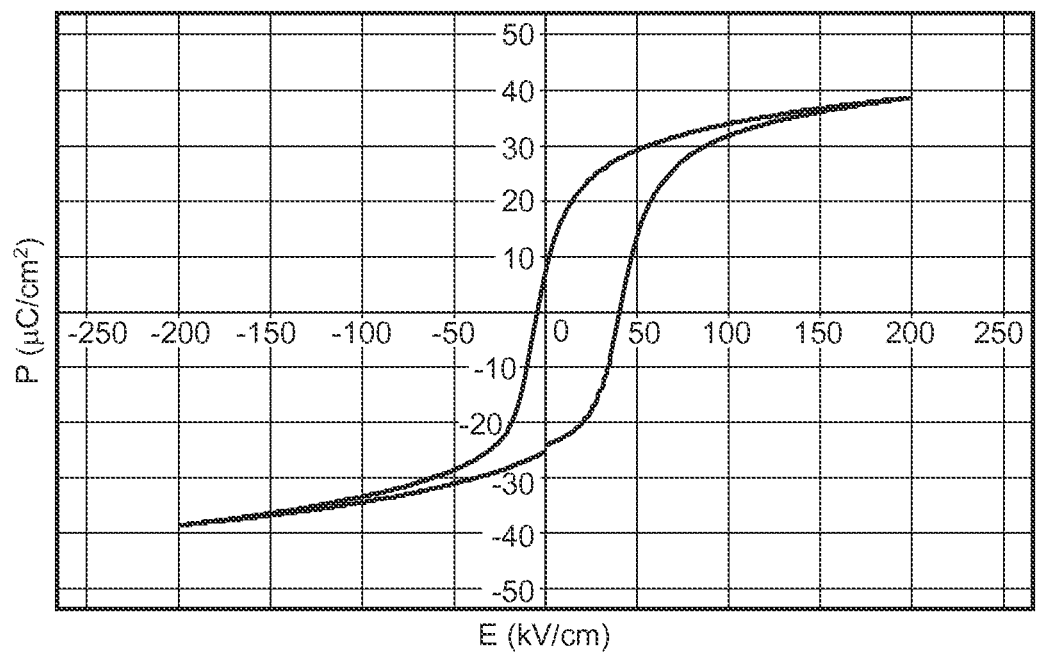
FIG. 9 is a graph illustrating Pr-E hysteresis characteristics of the piezoelectric body film (Nb-PZT) according to the embodiment.

FIG. 9 is a graph illustrating the Pr-E hysteresis characteristics of the piezoelectric body film (Nb-PZT) according to the embodiment. In a case where the piezoelectric element using the Nb-doped PZT film having such asymmetric hysteresis characteristics is used as the ejection energy generating element for the ink-jet printer, for example, an electric field sufficiently larger than the coercive electric field on the negative electrode side (absolute value thereof is larger) is applied for use. As an example, drive is performed with a drive voltage having a magnitude of 20V (electrical potential difference) with respect to the piezoelectric body film having the film thickness of 3 μm. This drive voltage exceeds the coercive electric field, giving no concern for the depolarization.

On the other hand, for the purpose of a sensor such as a gyro sensor, drive is performed with a fine voltage smaller than the coercive electric field on the negative electrode side (e.g., small voltage of 1V or less, or 0.5V or less). In depolarization, if the drive voltage of this fine voltage is applied, the polarized state cannot be restored, but since the absolute value of the coercive electric field is far smaller as compared to the PZT of related art, the polarization treatment can be conducted with application of a relatively low voltage of about from 1V to several volts (which is a treatment for restoring the polarized state, referred to as "refresh treatment"). A general power supply of the ASIC for device drive is around 5V or 3V, and therefore, the polarization (restoration for the polarized state) treatment can be conducted sufficiently with a degree of the output voltage of the ASIC for device drive.

Figure 10:
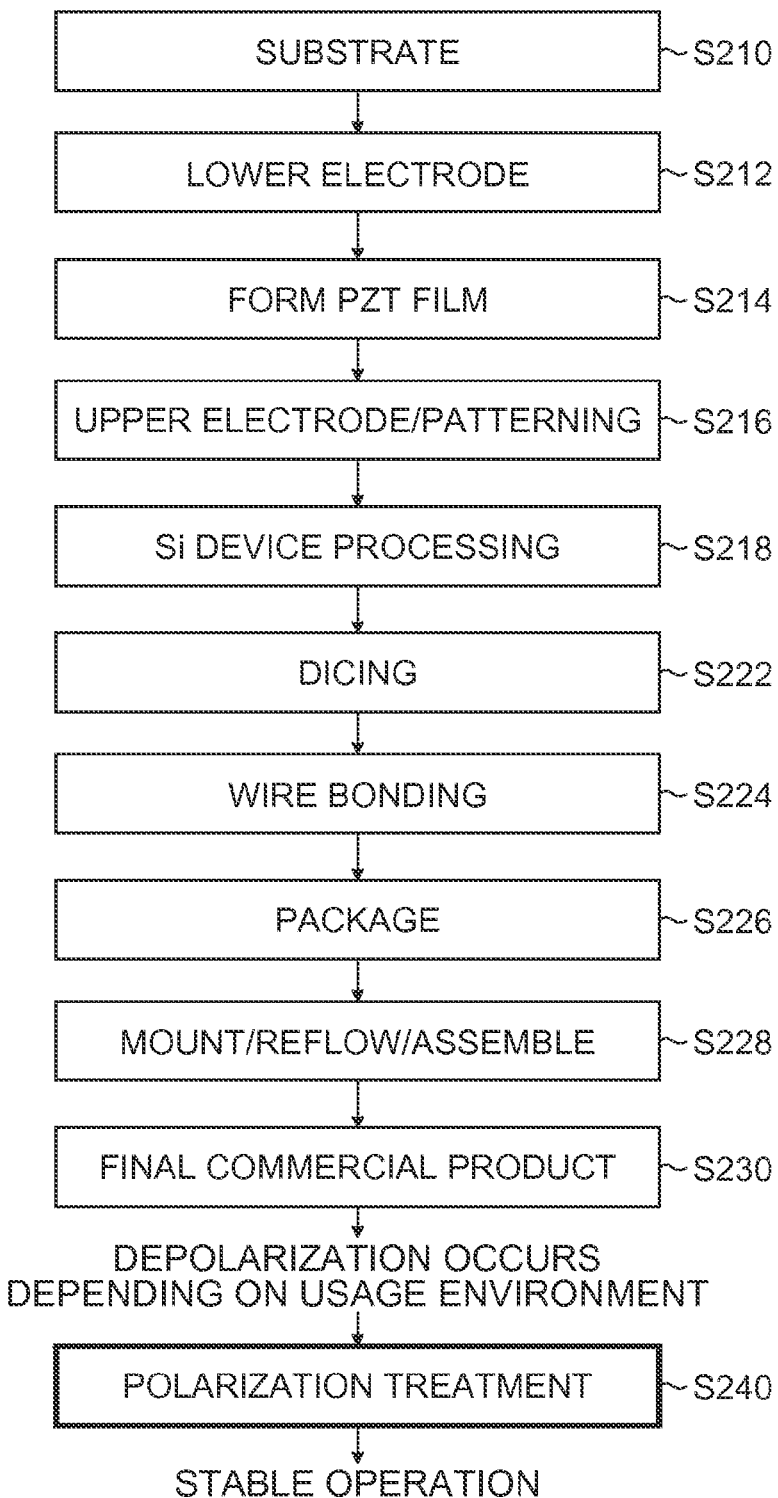
FIG. 10 is a flowchart illustrating a manufacturing method and using method of the piezoelectric device according to the embodiment.

FIG. 10 illustrates as a flowchart the manufacturing process for the piezoelectric device and the refresh treatment after finishing the final commercial product (also referred to as "repolarization treatment" or "restoration treatment for polarized state") according to the embodiment. In FIG. 10, the stages same as or similar to the flow of related art described in FIG. 6 are designated by the same step numbers. A description is given of a manufacturing method and using method of the piezoelectric device according to the embodiment with reference to FIG. 10.

(Stage 1): First, a substrate is prepared (step S210 in FIG. 10). A monocrystalline bulk silicon substrate (Si wafer) may be used or an SOI (Silicon On Insulator) substrate may be used.

(Stage 2): Next, a lower electrode (corresponding to "first electrode") is formed on a surface of one side of the substrate (step S212, "lower electrode forming stage"). For example, a TiW film having a film thickness of 20 nm is formed by the sputtering method, on which an Ir film having a film thickness of 150 nm is formed to be overlaid. This laminated film of TiW (20 nm)/Ir (150 nm) serves as a lower electrode. Materials of the lower electrode and the film thickness of each layer are not limited to the above example, but various designs may be made.

(Stage 3): After that, an Nb-doped PZT film (piezoelectric body film 42) is formed on the lower electrode (step S214, "piezoelectric body film forming stage"). For example, an Nb-doped PZT thin film (reference numeral 42) having the film thickness of 2 µm is formed on the lower electrode by the sputtering method at a film formation temperature of 500° C.

(Stage 4): Further, an upper electrode is formed on the PZT thin film and patterned so as to have a desired shape (step S216, "upper electrode forming stage"). For example, the upper electrode has the laminated structure of IrO/Ir/Au. Note that in expressing the laminated structure, a structure having A material layer, B material layer, and C material layer laminated in this order from the lower layer toward the upper layer is represented by an expression "A/B/C". In other words, the expression is made such that the material put before "/" constitutes the lower layer and the material put after "/" constitutes the upper layer.

(Stage 5): After that, the substrate is processed so as to have a desired shape and thickness (step S218, "Si device processing stage"). Device processing technology such as lithography, ashing, and Si deep etching is used for processing.

(Stage 6): Then, isolation is performed by dicing from the wafer to individual element units (step S222, "dicing stage").

(Stage 7): Next, the individually isolated elements are electrically connected to the integrated circuit by wire bonding (step S224, "wire bonding stage").

(Stage 8): After that, the device is packaged with the packaging member (step S226, "packaging stage"). In this way, the packaged sensor device is obtained.

(Stage 9): The packaged device is mounted on the electronic circuit board ("mounting stage"), and undergoes the reflow treatment ("reflow stage", step S228). Reflow, which is a known technology as a surface-mount technology, is the state where, in mounting electronic components on a circuit board such as a printed board, the electronic components are put on the board to which solder paste is applied in advance, and subjected to a heating treatment to collectively perform solder bonding. Of course, the electronic circuit board can have other various electronic components, without limitation to the device of this example, mounted thereon, and each electronic component is fixed (solder-bonded) to the electronic circuit board by the reflow. In this way, the electronic circuit board with the device installed thereon is produced. Thereafter, the electronic circuit board is assembled into the electronic equipment in the electronic equipment assembly stage (step S228) to manufacture the final commercial product (electronic equipment) (step S230).

During the process until the final commercial product is finished, the polarization treatment (treatment corresponding to step S220 in FIG. 7 and step S215 in FIG. 8) is not required.

Note the electronic equipment herein may include, for example, a mobile phone, digital camera, personal computer, digital music player, game console, medical equipment such as an electronic endoscope and other various equipment, with no particular limitation on the target equipment.

The electronic equipment as the final product through usage may generate the depolarization in the piezoelectric body film depending on the usage environment or aged deterioration due to the long time usage. In the embodiment, in order to direct to performance deterioration due to such depolarization, the polarization treatment shown at step S240 in FIG. 10 is conducted. The polarization treatment stage (step S240) herein is the stage where the refresh voltage is applied in order to restore a polarized state due to the depolarization to the original polarized state (refresh treatment stage). This refresh treatment can maintain/restore the device performance.

The Pr-E hysteresis is required to be biased as the piezoelectric body for achieving the refresh treatment in order to maintain the device performance. The biased Pr-E hysteresis characteristics of the piezoelectric body can be achieved by adding Nb or Bi to the PZT. The more an amount of Pb is, the larger the bias ratio becomes.

Using such a piezoelectric body having large bias ratio allows the polarization treatment to be conducted with a low voltage (e.g., 5V or less) even after the final product is finished. According to the embodiment, the refresh treatment can be conducted after a long time usage of the device to make the device sensitivity stable. In addition, in a case of the depolarization after the usage under a severe environment such as with a high temperature, the refresh treatment can be conducted to restore the original polarized state.

<Determination of Refresh Voltage>

The voltage applied in a refresh treatment (refresh voltage) is preferably that for applying the electric field having a magnitude of 10 kV/cm or more with which an inclination of the polarization degree rapidly changes from the experiment result in FIG. 5. An application of this electric field having a value equal to or larger than electric field intensity may promise the polarization degree of 80% or more.

The film thickness of the piezoelectric body film for the sensor purpose or actuator purpose is assumed to be, for example, equal to or lager than 1 µm and equal to or less than 5 µm, preferably equal to or less than 4 µm, more preferably equal to or less than 3 µm. It is preferable that the film thickness is thin as much as possible, and the structure may be such that, for example, the refresh voltage of about 2V to 3V is applied to the piezoelectric body film having the film thickness of 1 to 2 µm for conducting the refresh treatment.

A time to conduct the polarization treatment for refresh may be any time. The device after attached to a smartphone or mobile phone, game console, and electronic equipment such as a digital camera can be regularly or irregularly subjected to the refresh treatment to always maintain a good performance.

There are various aspects in conducting the refresh treatment, including an aspect of automatically conducting when the device is started up or the equipment is reset, an aspect of conducting forcedly by software, an aspect of conducting at an adequate timing in response to a user operation and the like, that is, the refresh treatment may be conducted any time. In a case of the device including a plurality of piezoelectric elements, the refresh voltage may be applied individually to each electrode or to all channels at the same time. As for a polarization treatment time, one second is enough. According to experiment data, if the refresh voltage is applied for about one second, the performance of 80% or more of that in the case of applying the refresh voltage for one minute is exerted. Therefore, the refresh voltage application for a short time of about one second is enough.

Example 1

Similarly to the preliminary experiment, a lower electrode was formed on an SOI wafer as the substrate 14 and a PZT doped with 12% Nb (Nb-doped PZT) having a thickness of 2 µm was formed to be overlaid on the lower electrode. This piezoelectric body film, whose bias ratio of the P-E hysteresis was 75% (see FIG. 9), had been polarized in advance. This piezoelectric body film was used as it was (without the polarization treatment), and, after an upper electrode was formed, subjected to the device processing such as lithography, ashing, and Si deep etching to be processed into a gyro sensor having a form described in FIG. 3 and FIG. 4.

The coercive electric field value |Ec1| (value of the coercive electric field Ec1 whose absolute value is smaller) of the piezoelectric body film is 6 kV/cm, and the gyro sensor according to Example 1 is a device driven with the electric field intensity equal to or less than the coercive electric field value |Ec1|=6 kV/cm.

Drive was performed with the drive voltage of 0.14V, the lower electrode being grounded, and a minus voltage being applied to the upper electrode, confirming a good operation.

Further, assuming that this piezoelectric body film had been used for a long time, the polarization treatment in the reverse direction was intentionally conducted (reverse polarization treatment). The reverse polarization treatment created the state of the performance degraded due to the depolarization. After that, a voltage of about 2V was applied from the ASIC (electronic circuit unit 30 in FIG. 1) for about one second (with the lower electrode being grounded and a minus voltage being applied to the upper electrode) such that the electric field having the electric field intensity of 10 kV/cm was applied.

After the refresh treatment above, drive was again performed with 0.14V, confirming a good operation with a slightly lower level than the above driving but without problems in practical use (see "Example 1" in FIG. 11).

In this Example 1, the depolarized state was generated using the reverse polarization treatment, but in the actual device, time degradation due to the long time usage or the usage environment brings about the depolarization, and therefore, the refresh treatment (refresh voltage application) is conducted such that the polarized state can be restored and the operation performance of the device can be maintained/restored.

Note that the refresh treatment cannot necessarily restore the complete original polarized state, but, the performance can be maintained in an acceptable range with no problem in the practical performance of the device.

<Refresh Voltage Condition>

The electric field intensity applied for maintaining the device performance is associated with the Pr-E hysteresis bias of the piezoelectric material. The electric field intensity applied in the refresh treatment is preferably equal to or less than three times the coercive electric field value |Ec1| on a device driving voltage side (minus side in this example). The electric field intensity for this is roughly 30 kV/cm or less. An upper limit of the electric field intensity applied in the refresh treatment is set only as a guide to equal to or less than three times the coercive electric field value |Ec1|, but may be a value exceeding three times so long as it is in a range which can be directed by the ASIC.

In Example 1, since the coercive electric field value |Ec1| on the minus side is about 6 kV/cm (see FIG. 9), the electric field intensity of 18 kV/cm which is three times 6 kV/cm may only be applied to sufficiently conduct the polarization treatment (refresh treatment).

As a specific voltage of the refresh treatment, the voltage value as compared to the ASIC design is preferably equal to or less than 5V, more preferably equal to or less than 3V, and further preferably equal to or less than 1.5V.

A lower limit of the refresh voltage is set to a voltage larger than the drive voltage for the device driving with a fine voltage. In other words, it is preferable that the refresh voltage has a voltage value for applying the electric field of the electric field intensity larger than the electric field intensity for operating the device, and that the electric field intensity applied to the piezoelectric body film by applying the refresh voltage is equal to or less than three times the coercive electric field value |Ec1|.

Achievement of the polarization treatment with such a low voltage can be achieved by designing the material which lowers a value of the coercive electric field on the device driving polarity side (negative side in this Example), or thinning the thickness of the piezoelectric body film.

Selection of the piezoelectric material and design of the film thickness are design parameters in carrying out the invention.

Example 2

Instead of the piezoelectric body film in Example 1, a piezoelectric body film having a thickness of 2 µm was produced with the Nb doped amount of 8 at %, the bias ratio of the Pr-E hysteresis of 23%, and the coercive electric field on the negative side of "−30 kV/cm", and a gyro sensor was produced with other conditions being similar to Example 1. Drive was performed with the drive voltage of 0.14V with the lower electrode being grounded, a minus voltage being applied to the upper electrode, confirming a good operation.

The piezoelectric body film in Example 2 had the electric field intensity of 15 kV/cm at which the polarization degree reached 80% after the reverse polarization treatment.

Further, assuming that this piezoelectric body film had been used for a long time, the polarization treatment in the reverse direction was intentionally conducted (reverse polarization treatment). The reverse polarization treatment created the state of the performance degraded due to the depolarization. After that, a voltage of about 3V was applied from the ASIC (electronic circuit unit 30 in FIG. 1) for about one second (with the lower electrode being grounded and a minus voltage being applied to the upper electrode) such that the electric field having the electric field intensity of 15 kV/cm was applied.

After the refresh treatment above, drive was again performed with 0.14V, confirming a good operation with a slightly lower level than the above driving but without problems in practical use (see "Example 2" in FIG. 11).

Comparative Example 2

As Comparative Example 1, a piezoelectric body film having a thickness of 2 µm was produced with the Nb doped amount of 3 at %, the bias ratio of the P-E hysteresis of 4%, and the coercive electric field on the negative side of −46 kV/cm. Since this piezoelectric body film had not been sufficiently polarized in advance, the film formation was followed by forming an Al electrode on all over the surface of the piezoelectric body film to conduct the polarization treatment. After that, the Al electrode was etched to be peeled off and the upper electrode was formed. Thereafter, the device processing such as lithography, ashing, and Si deep etching was performed to produce a gyro sensor having a form similar to that in FIG. 3 and FIG. 4.

The obtained device characteristics were examined to find an element not sufficiently polarized and probably depolarized. Which stage this was depolarized at could not be clearly found out.

The piezoelectric body film in Comparative Example 1 had the electric field intensity of 30 kV/cm at which the polarization degree reached 80% after the reverse polarization treatment. Subjecting the device in Comparative Example 1 to the repolarization treatment required the voltage application of 6V or more, which made it impossible to conduct the polarization treatment by the ASIC (see "Comparative Example 1" in FIG. 11).

Comparative Example 2

As Comparative Example 2, a piezoelectric body film having a thickness of 2 µm was produced with the Nb doped amount of 0 at %, the bias ratio of the P-E hysteresis of 3%, and the coercive electric field on the negative side of −48 kV/cm. Since this piezoelectric body film had not been polarized in advance, the film formation was followed by forming an Al electrode on all over the surface of the piezoelectric body film to conduct the polarization treatment. After that, the Al electrode was etched to be peeled off and the upper electrode was formed. Thereafter, the device processing such as lithography, ashing, and Si deep etching was performed to produce a gyro sensor having a form similar to that in FIG. 3 and FIG. 4.

The obtained device characteristics were examined to find an element not sufficiently polarized and probably depolarized. The piezoelectric body film in Comparative Example 2 had the electric field intensity of 60 kV/cm at which the polarization degree reached 80% after the reverse polarization treatment. Subjecting the device in Comparative Example 2 to the repolarization treatment required the voltage application of 12V or more, which made it impossible to conduct the polarization treatment by the ASIC (see "Comparative Example 2" in FIG. 11).

The results obtained from Examples 1 and 2, and Comparative Examples 1 and 2 described above were summarized in a table in FIG. 11. As for designations in determination fields in the table in FIG. 11, "A" represents a good evaluation and "C" represents a bad or unsuitable evaluation.

As illustrated in FIG. 11 in Example 1 (bias ratio 75%) and Example 2 (bias ratio 23%), a good result can be obtained for those of the bias ratio of 20% or more. Particularly, for those of the bias ratio of 70% or more, the polarized state can be restored with lower refresh voltage. Further, these are preferable as the materials because the polarization condition is good in the initial state.

With variations of the conditions from the result of Example 1 (bias ratio 75%) taken into account, the bias ratio of 70% or more is considered to be sufficient.

<Automatic Refresh Function in Angular Velocity Sensor (Gyro Sensor)>

Figure 12:
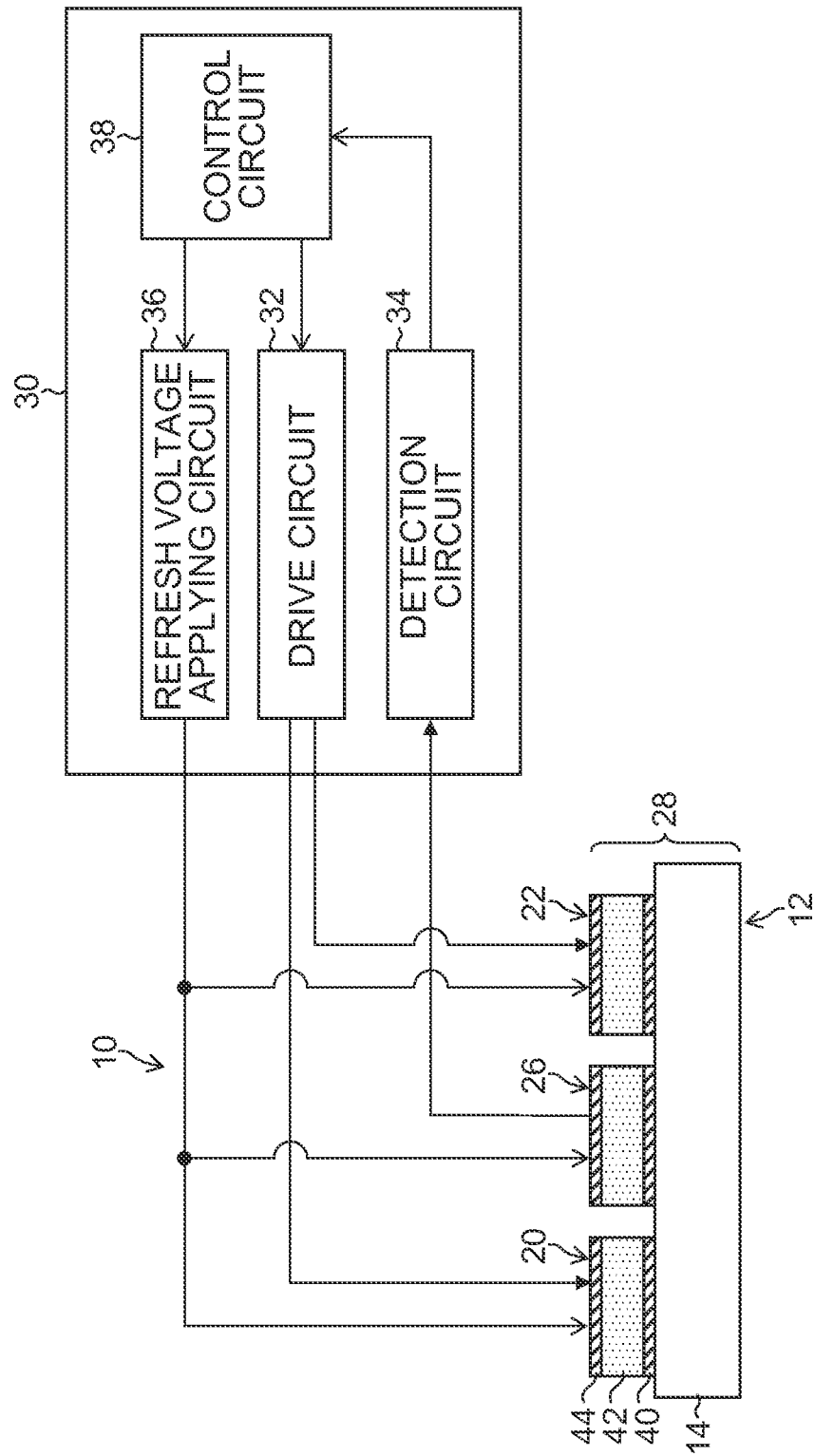
FIG. 12 is a structure diagram illustrating another embodiment of the invention.

FIG. 12 is a structure diagram illustrating another embodiment of the invention. In FIG. 12, the same or similar components to the structure illustrated in FIG. 1 are designated by the same reference numerals, and a description thereof is omitted.

As already described, in the piezoelectric device 10 used as the angular velocity sensor, gyro sensor or the like, which includes a structure in which the piezoelectric elements for drive 20 and 22 and the piezoelectric element for detection 26 are combined, when the piezoelectric elements for drive 20 and 22 are driven, the detection voltage is obtained from the piezoelectric element for detection 26. Therefore, the detection voltage output in driving with a certain specific drive voltage is compared with a reference value (a threshold defined in advance) to make it possible to determine whether or not the performance deterioration due to the depolarization occurs.

An embodiment illustrated in FIG. 12 has a structure including a control circuit 38 automatically determining presence or absence of the performance deterioration due to the depolarization to control the refresh treatment to be conducted (corresponding to "control means").

In other words, the piezoelectric device 10 includes the control circuit 38 in which in a case where the detection voltage is lower than the reference value, the detection voltage being output from the piezoelectric element for detection 26 when the piezoelectric elements for drive 20 and 22 are driven with a predetermined drive voltage, a voltage is applied to sensor element unit 28 from the refresh voltage applying circuit 36.

The control circuit 38 sends an instruction to the drive circuit 32 to drive the piezoelectric elements for drive 20 and 22 with a certain specific (predetermined) drive voltage, and acquires information of the detection voltage obtained from the piezoelectric element for detection 26 in the driving. If the detection voltage is lower than a predetermined reference value, the performance deterioration due to the depolarization can be determined to be occurring. The control circuit 38, on the basis of this determination result, automatically determines whether or not the refresh treatment is required, and if required, sends an instruction to the refresh voltage applying circuit 36 to control the refresh voltage applying circuit 36 to supply the refresh voltage.

The control circuit 38 may be variously designed including an aspect of using a comparator which compares a signal obtained from the detection circuit 34 with a predetermined reference value to output the comparison result, or an aspect of using a CPU (central processing unit), for example.

The control circuit 38 for achieving such a control function can be installed into the ASIC (electronic circuit unit 30). The control circuit 38 is not limited to the form of being installed into the electronic circuit unit 30, but may be installed into an external circuit unit or apparatus.

Other Application Example

The invention can be applied to various forms of sensor device or actuator device without being limited to the above illustrated angular velocity sensor and gyro sensor. Without being limited to a sensor having the structure in which the actuator for drive illustrated in FIG. 1 (using the inverse piezoelectric effect) and the piezoelectric body for sensor (using the piezoelectric effect) are combined, the invention can be also applied to a sensor element using only the piezoelectric effect or an actuator element using only the inverse piezoelectric effect.

In a case of a sensor device not including the piezoelectric element for drive, the electric field intensity according to an electrical potential difference generated between the electrodes of the piezoelectric element for detection corresponds to the "electric field intensity for operating" the relevant device.

The purposes of the piezoelectric body device according to the invention may include various purposes for the angular velocity sensor, the acceleration sensor, pressure sensor, actuator, and power generation device, and particularly, effects are exerted in those used in a fine voltage driven region or fine voltage sensing.

The present invention is not limited to the embodiments described above and many modifications can be made by a person having ordinary skill in the art within the technical idea of the invention.

What is claimed is:

1. A piezoelectric device operating by a piezoelectric effect and an inverse piezoelectric effect of a piezoelectric body film, the device comprising:
    a piezoelectric element unit; and
    a refresh voltage applying circuit, wherein
    bipolar polarization-electric field (Pr-E) hysteresis characteristics of a piezoelectric material are asymmetrically biased with respect to an axis of a zero electric field, and
    when a first coercive electric field having smaller absolute value is defined as Ec1 and a second coercive electric field having larger absolute value is defined as Ec2 of coercive electric fields in the piezoelectric material, and
    a bias ratio of the coercive electric field is defined as $[(Ec2+Ec1)/(Ec2-Ec1)] \times 100 [\%]$,
    the piezoelectric element unit includes the piezoelectric body film whose bias ratio of the coercive electric field is equal to or more than 20%, and the piezoelectric element unit operates with an electric field intensity smaller than that of the first coercive electric field, and
    the refresh voltage applying circuit applies a voltage in order to restore a polarized state of the piezoelectric body film and maintain operation performance of the piezoelectric device, the voltage having an electric field intensity larger than the electric field intensity for the operating and being equal to or less than three times the absolute value |Ec1| of the first coercive electric field, wherein
    the piezoelectric element unit includes a piezoelectric element for drive configured to operate by an inverse piezoelectric effect, and a piezoelectric element for detection configured to operate by a piezoelectric effect,
    the piezoelectric device includes a drive circuit configured to supply a drive voltage to the piezoelectric element for drive, and a detection circuit configured to detect a voltage signal from the piezoelectric element for detection,
    the refresh voltage applying circuit is installed in at least one circuit of the drive circuit and the detection circuit, and
    the piezoelectric device further comprises a control unit configured to apply a voltage to the piezoelectric element unit from the refresh voltage applying circuit in a case where a detection voltage is lower than a reference value, the detection voltage being output from the piezoelectric element for detection when the piezoelectric element for drive is driven with a predetermined drive voltage.

2. The piezoelectric device according to claim 1, wherein the bias ratio of the piezoelectric body film is equal to or more than 70%.

3. The piezoelectric device according to claim 1, wherein an electronic circuit unit including at least one circuit of the drive circuit and the detection circuit, and the refresh voltage applying circuit is constituted by an integrated circuit.

4. The piezoelectric device according to claim 1, wherein a magnitude of a voltage supplied from the refresh voltage applying circuit to the piezoelectric element unit is equal to or less than 5V.

5. The piezoelectric device according to claim 1, wherein the piezoelectric element unit has a laminated structure in which a first electrode, the piezoelectric body film, and a second electrode are laminated, and
    the refresh voltage applying circuit applies a minus voltage to the second electrode when the first electrode is grounded.

6. The piezoelectric device according to claim 1, wherein the piezoelectric body film is perovskite-type oxide.

7. The piezoelectric device according to claim 1, wherein the piezoelectric body film is formed of one kind or plural kinds of perovskite-type oxide expressed by a general formula (P-1) below (which may contain inevitable impurities), $$Pb_a(Zr_{b1}Ti_{b2}X_{b3})O_3 \qquad \text{general formula (P-1)}$$

(in the formula (P-1), X is at least one kind of metal element selected from element groups of a V group and a VI group; a>0, b1>0, b2>0, b3≥0; while a≥1.0 and b1+b2+b3=1.0 as a standard, these numerical values may include a tolerance from 1.0 in a range where a perovskite structure can be taken).

8. The piezoelectric device according to claim 7, wherein X of the piezoelectric body film is Nb, b3 is equal to or more than 0.05 and equal to or less than 0.3.

9. The piezoelectric device according to claim 7, wherein X of the piezoelectric body film is at least one kind of metal element of Nb and Bi.

10. The piezoelectric device according to claim 7, wherein a is equal to or more than 1.1 in the general formula (P-1) for the piezoelectric body film.

11. A method for using a piezoelectric device which is operated by use of at least one of a piezoelectric effect and an inverse piezoelectric effect of a piezoelectric body film and with an electric field intensity smaller than that of a first coercive electric field, the piezoelectric device including a piezoelectric element for drive configured to operate by an inverse piezoelectric effect, and a piezoelectric element for detection configured to operate by a piezoelectric effect, wherein
    bipolar polarization-electric field (Pr-E) hysteresis characteristics of a piezoelectric material are asymmetrically biased with respect to an axis of a zero electric field, and
    when a first coercive electric field having smaller absolute value is defined as Ec1 and a second coercive electric field having larger absolute value is defined as Ec2 of coercive electric fields in the piezoelectric material, and
    a bias ratio of the coercive electric field is defined as $[(Ec2+Ec1)/(Ec2-Ec1)] \times 100 [\%]$,
    the piezoelectric body film whose bias ratio of the coercive electric field is equal to or more than 20% is used, and
    in a case where a detection voltage is lower than a reference value, the detection voltage being output from the piezoelectric element for detection when the piezoelectric element for drive is driven with a predetermined drive voltage, a voltage is applied in order to maintain operation performance of the piezoelectric device, the voltage having an electric field intensity larger than the electric field intensity for the operating and being equal to or less than three times an absolute value |Ec1| of the first coercive electric field, such that a polarized state of the piezoelectric body film is restored.

* * * * *